(12) United States Patent
Lim et al.

(10) Patent No.: US 10,541,336 B2
(45) Date of Patent: Jan. 21, 2020

(54) SEMICONDUCTOR DEVICE WITH DUMMY HOLE

(71) Applicant: Samsung Display Co., Ltd., Yongin-Si, Gyeonggi-Do (KR)

(72) Inventors: Junhyung Lim, Seoul (KR); Jaybum Kim, Seoul (KR); Kyoungseok Son, Seoul (KR); Jihun Lim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 150 days.

(21) Appl. No.: 15/724,600

(22) Filed: Oct. 4, 2017

(65) Prior Publication Data

US 2018/0248045 A1 Aug. 30, 2018

(30) Foreign Application Priority Data

Feb. 27, 2017 (KR) .................. 10-2017-0025705

(51) Int. Cl.
| | |
|---|---|
| *H01L 29/786* | (2006.01) |
| *H01L 21/02* | (2006.01) |
| *H01L 21/322* | (2006.01) |
| *H01L 51/52* | (2006.01) |
| *H01L 29/423* | (2006.01) |
| *H01L 27/32* | (2006.01) |

(Continued)

(52) U.S. Cl.
CPC .... *H01L 29/78609* (2013.01); *H01L 21/0242* (2013.01); *H01L 21/322* (2013.01); *H01L 27/1277* (2013.01); *H01L 27/3253* (2013.01); *H01L 29/04* (2013.01); *H01L 29/42384* (2013.01); *H01L 29/7869* (2013.01); *H01L 29/78675* (2013.01); *H01L 51/5296* (2013.01)

(58) Field of Classification Search
CPC ......... H01L 29/78672; H01L 29/78675; H01L 29/7869
USPC ........................................... 257/72
See application file for complete search history.

(56) References Cited

U.S. PATENT DOCUMENTS

| | | | |
|---|---|---|---|
| 7,075,614 B2 | 7/2006 | Izumi et al. | |
| 7,374,981 B2 | 5/2008 | Yamaguchi et al. | |
| 8,106,402 B2 | 1/2012 | Yeo et al. | |

(Continued)

FOREIGN PATENT DOCUMENTS

| | | |
|---|---|---|
| KR | 1020160086502 A | 7/2016 |
| KR | 101651679 B1 | 8/2016 |
| KR | 1020160098601 A | 8/2016 |

*Primary Examiner* — Nilufa Rahim
(74) *Attorney, Agent, or Firm* — Cantor Colburn LLP

(57) ABSTRACT

A semiconductor device may include a base substrate, a first thin-film transistor ("TFT") provided on the base substrate, a second TFT provided on the base substrate, and a plurality of insulating layers provided on the base substrate to define at least one dummy hole that is not overlapped with the first and second TFTs. The first TFT may include a first input electrode, a first output electrode, a first control electrode, and a first semiconductor pattern including a crystalline semiconductor material, and the second TFT may include a second input electrode, a second output electrode, a second control electrode, and a second semiconductor pattern including an oxide semiconductor material. A shortest distance between the at least one dummy hole and the second semiconductor pattern may be equal to or shorter than 5 micrometers (μm), in a plan view.

18 Claims, 11 Drawing Sheets

(51) Int. Cl.
*H01L 29/04* (2006.01)
*H01L 27/12* (2006.01)

(56) References Cited

U.S. PATENT DOCUMENTS

| | | |
|---|---|---|
| 8,269,217 B2 | 9/2012 | Arai et al. |
| 8,698,160 B2 | 4/2014 | Ohtani |
| 9,318,614 B2 | 4/2016 | Shieh et al. |
| 2010/0182223 A1* | 7/2010 | Choi .................... G09G 3/3233 345/76 |
| 2012/0001167 A1 | 1/2012 | Morosawa |
| 2014/0264329 A1 | 9/2014 | Yamazaki et al. |
| 2016/0188061 A1* | 6/2016 | Cho ...................... G06F 3/0412 345/173 |
| 2016/0204172 A1 | 7/2016 | Park |
| 2016/0233253 A1 | 8/2016 | Kim |
| 2017/0263609 A1* | 9/2017 | Endo ................... H01L 27/1052 |
| 2018/0061317 A1* | 3/2018 | Morita ................ G02F 1/13452 |

\* cited by examiner

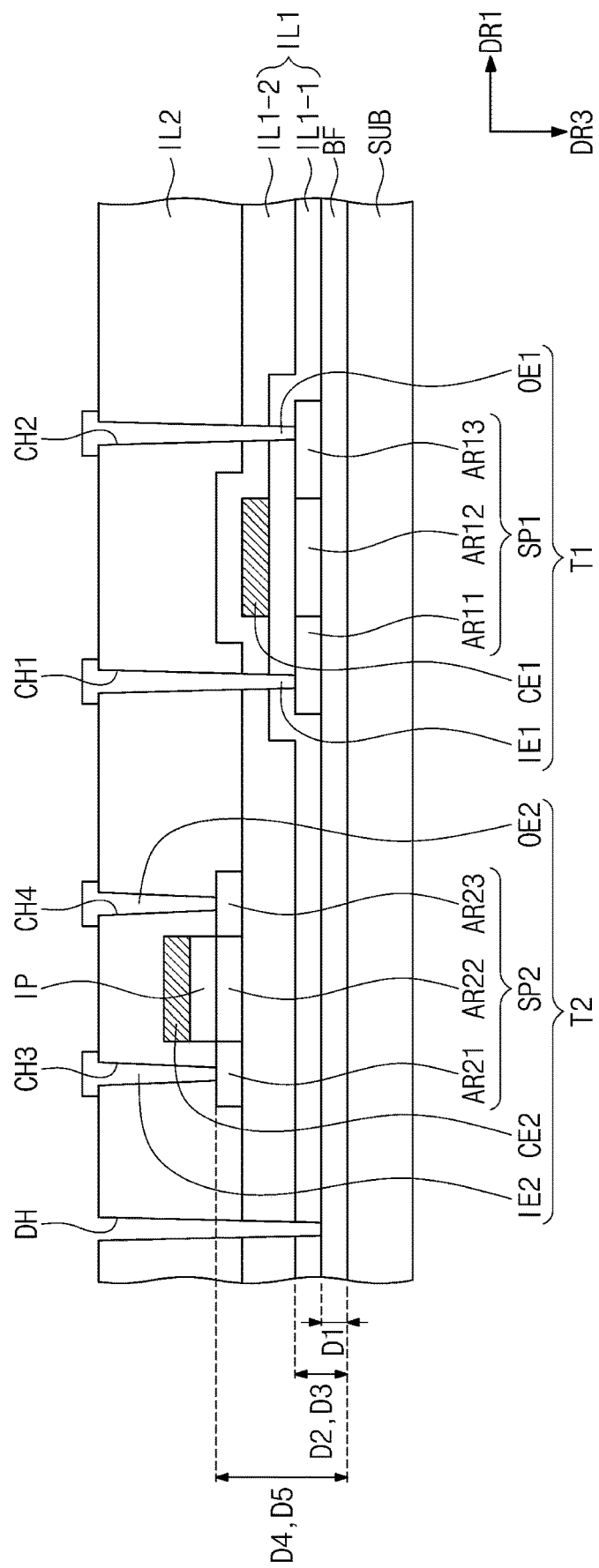

SEMICONDUCTOR DEVICE WITH DUMMY HOLE

This application claims priority to Korean Patent Application No. 10-2017-0025705, filed on Feb. 27, 2017, and all the benefits accruing therefrom under 35 U.S.C. § 119, the content of which in its entirety is herein incorporated by reference.

BACKGROUND

1. Field

Exemplary embodiments of the invention relate to a semiconductor device, and in particular, to a semiconductor device including both of crystalline and oxide semiconductor materials.

2. Description of the Related Art

A semiconductor device includes at least one thin-film transistor ("TFT"). The TFT includes a semiconductor pattern including a semiconductor material. A display device, which is an example of the semiconductor device, generally includes a plurality of pixels and a driving circuit, which is used to control the plurality of pixels. The driving circuit includes at least one TFT. The at least one TFT of the driving circuit provides electrical control signals to the pixel.

Each of the plurality of pixels includes a pixel driving circuit and a display element connected to the pixel driving circuit. The pixel driving circuit includes at least one TFT and at least one capacitor. The at least one TFT and the at least one capacitor of the pixel driving circuit control the display element, based on electrical control signals provided from the driving circuit.

SUMMARY

Exemplary embodiments of the invention provide a semiconductor device, of which threshold voltage may be easily controlled.

Exemplary embodiments of the invention provide a semiconductor device having high uniformity in threshold voltage.

Exemplary embodiments of the invention provide a semiconductor device, in which a short oxide semiconductor pattern is provided, and which is advantageous to realize a high resolution property.

According to an exemplary embodiment of the invention, a semiconductor device may include a base substrate, a first thin-film transistor ("TFT") provided on the base substrate, the first TFT including a first input electrode, a first output electrode, a first control electrode, and a first semiconductor pattern including a crystalline semiconductor material, a second TFT provided on the base substrate, the second TFT including a second input electrode, a second output electrode, a second control electrode, and a second semiconductor pattern including an oxide semiconductor material, and a plurality of insulating layers provided on the base substrate to define at least one dummy hole that is not overlapped with the first and second TFTs. A shortest distance between the at least one dummy hole and the second semiconductor pattern may be equal to or shorter than 5 micrometers ($\mu m$), in a plan view.

In an exemplary embodiment, the at least one dummy hole may be provided to meet following inequality 1:

$$2 \ \mu m \times 2 \ \mu m \leq X \ \mu m^2 \leq 2 \ \mu m \times Y \ \mu m, \qquad \text{[Inequality 1]}$$

where X may be a total planar area of the at least one dummy hole, and Y may be a length of the second semiconductor pattern.

In an exemplary embodiment, the shortest distance may be equal to or shorter than 2.5 $\mu m$.

In an exemplary embodiment, the at least one dummy hole may be not filled with a conductive material.

In an exemplary embodiment, at least a portion of the at least one dummy hole may be filled with an insulating material.

In an exemplary embodiment, the plurality of insulating layers may include a first insulating layer provided on the first semiconductor pattern and below the second semiconductor pattern and a second insulating layer provided on the second semiconductor pattern. The at least one dummy hole may be defined to penetrate the first insulating layer and the second insulating layer. The first insulating layer may have a multi-layered structure.

In an exemplary embodiment, the first input electrode and the first output electrode may be in contact with the first semiconductor pattern via a first through hole and a second through hole, respectively, and the second input electrode and the second output electrode may be in contact with the second semiconductor pattern via a third through hole and a fourth through hole, respectively.

In an exemplary embodiment, a distance between a bottom end of the at least one dummy hole and a top surface of the base substrate may be smaller than a distance between a bottom end of each of the first, second, third, and fourth through holes and the top surface of the base substrate.

In an exemplary embodiment, a length of a channel region of the second semiconductor pattern may be equal to or shorter than 2 $\mu m$.

In an exemplary embodiment, the semiconductor device may further include a light-emitting diode connected to the first TFT.

According to an exemplary embodiment of the invention, a semiconductor device may include a base substrate, a first TFT provided on the base substrate, the first TFT including a first input electrode, a first output electrode, a first control electrode, and a first semiconductor pattern including a crystalline semiconductor material, a second TFT provided on the base substrate, the second TFT including a second input electrode, a second output electrode, a second control electrode, and a second semiconductor pattern including an oxide semiconductor material, and a first insulating layer provided on the first semiconductor pattern and below the second semiconductor pattern, and a second insulating layer provided on the second semiconductor pattern. At least one dummy hole may be defined to penetrate through the first insulating layer and the second insulating layer. In a plan view, the at least one dummy hole may be not overlapped with the first and second TFTs and may be closer to the second semiconductor pattern than to the first semiconductor pattern.

BRIEF DESCRIPTION OF THE DRAWINGS

Exemplary embodiments, features and advantages of the disclosure will be more clearly understood from the following brief description taken in conjunction with the accompanying drawings, in which:

FIG. 4 is a cross-sectional view of an exemplary embodiment of a semiconductor device according to the invention;

DETAILED DESCRIPTION

Figure 1:
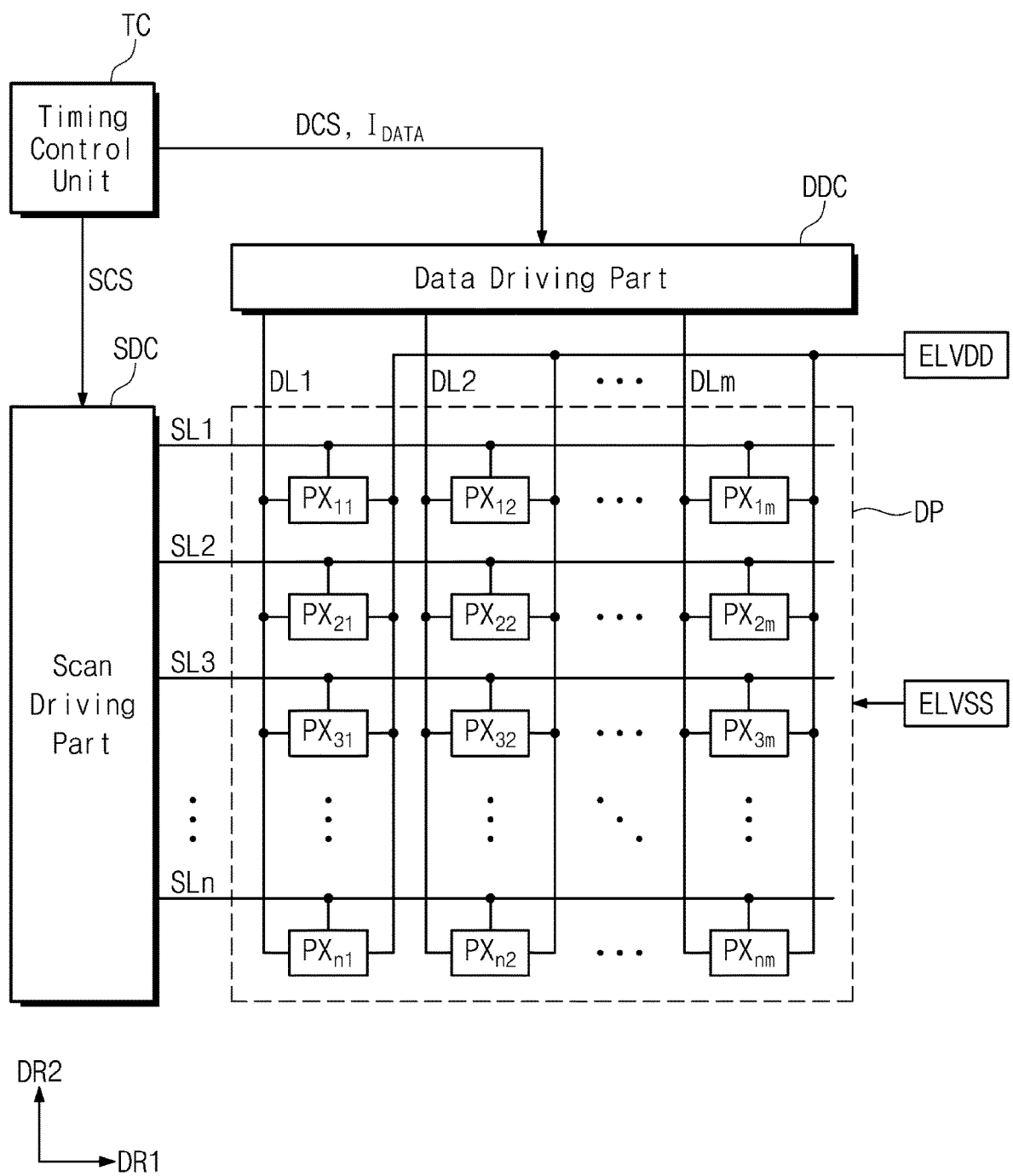
FIG. 1 is a block diagram of an exemplary embodiment of a semiconductor device according to the invention.

Exemplary embodiments of the disclosures will now be described more fully with reference to the accompanying drawings, in which exemplary embodiments are shown. Exemplary embodiments of the disclosures may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
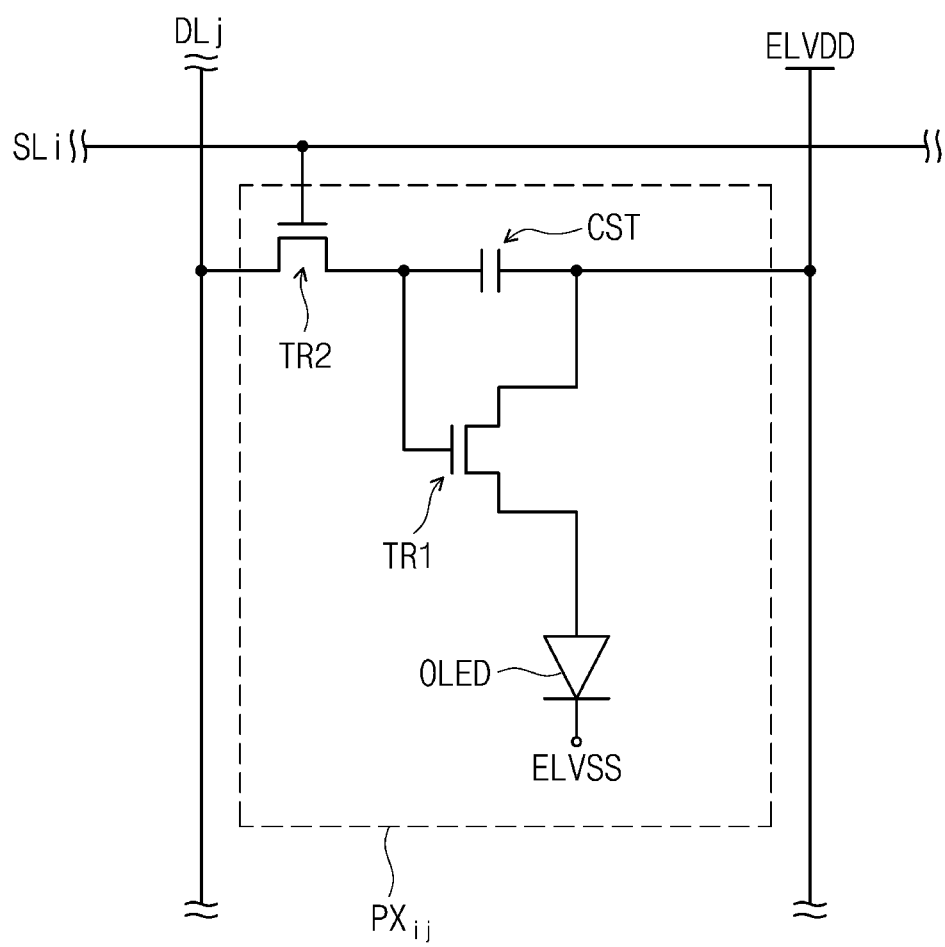
FIG. 2 is an equivalent circuit diagram of a pixel shown in FIG. 1.

FIG. 1 is a block diagram of a semiconductor device according to an exemplary embodiment of the invention. FIG. 2 is an equivalent circuit diagram of a pixel shown in FIG. 1.

Referring to FIG. 1, a semiconductor device according to an exemplary embodiment of the invention may include a timing control unit TC, a scan driving part SDC, a data driving part DDC, and a display panel DP. The display panel DP may display an image using electrical signals provided thereto. Hereinafter, a light-emitting type display panel will be described as an example of the display panel DP. However, the invention is not limited to a specific type of a display panel.

The timing control unit TC may receive input image signals and to output image data $I_{DATA}$ and various control signals SCS and DCS, and here, the image data $I_{DATA}$ may be converted to a form suitable for an operation mode of the display panel DP.

The scan driving part SDC may receive a scan control signal SCS from the timing control unit TC. The scan driving part SDC may generate a plurality of gate signals, in response to the scan control signal SCS. The scan control signal SCS may include a vertical start signal to initiate an operation of the scan driving part SDC, a clock signal to determine when to output signals, and so forth.

The data driving part DDC may receive a data driving control signal DCS and the converted image data $I_{DATA}$ from the timing control unit TC. The data driving part DDC may produce a plurality of data signals, based on the data driving control signal DCS and the converted image data $I_{DATA}$. The data signals may be provided to the display panel DP.

The display panel DP may display an image in accordance with electrical signals provided from the outside. The display panel DP may include a plurality of scan lines SL1-SLn, a plurality of data lines DL1-DLm, and a plurality of pixels PX11-PXnm where n and m are natural numbers.

The scan lines SL1-SLn may extend in a first direction DR1 and may be arranged in a second direction DR2 crossing the first direction DR1. The scan lines SL1-SLn may be sequentially applied with scan signals, which are produced by the scan driving part SDC.

The data lines DL1-DLm may be provided to cross the scan lines SL1-SLn and may be electrically disconnected from the scan lines SL1-SLn. The data lines DL1-DLm may extend in the second direction DR2 and may be arranged in the first direction DR1. The data lines DL1-DLm may receive data signals from the data driving part DDC.

The display panel DP may receive a first power voltage ELVDD and a second power voltage ELVSS, which are supplied from an external device. Each of the pixels $PX_{11}$-PXnm may be turned-on in response to the corresponding scan signal. Each of the pixels $PX_{11}$-PXnm may receive the first power voltage ELVDD and the second power voltage ELVSS and may generate light in response to the corresponding scan signal. The first power voltage ELVDD may be higher than the second power voltage ELVSS.

The pixels $PX_{11}$-PXnm may be arranged in the form of matrix. Each of the pixels $PX_{11}$-PXnm may be connected to a corresponding one of the scan lines SL1-SLn and a corresponding one of the data lines DL1-DLm. However, the invention is not limited thereto, and the pixels $PX_{11}$-PXnm may be arranged in various other forms.

Each of the pixels $PX_{11}$-PXnm may receive a scan signal from the corresponding scan line and may receive a data signal from the corresponding data line. Each of the pixels $PX_{11}$-PXnm may be turned-on in response to the corresponding scan signal. When the display panel DP is used to display an image, each of the pixels $PX_{11}$-PXnm may generate light in response to the corresponding data signal.

Referring to FIG. 2, each of the pixels $PX_{11}$-PXnm may include an organic light emitting diode OLED and a pixel driving circuit, which controls a light emitting operation of the organic light emitting diode OLED. The pixel driving circuit may include a plurality of thin-film transistors ("TFTs") TR1 and TR2 and a capacitor CST. At least one of the scan and data driving parts SDC (refer to FIG. 1) and DDC (refer to FIG. 1) may include TFTs, which are provided using the same process as that for the pixel driving circuit. An organic light emitting diode including an organic light emitting layer will be described as an example of a light-emitting diode according to exemplary embodiments of the invention. However, the invention is not limited thereto. In exemplary embodiments, a light emitting layer of the light-emitting diode may include an inorganic luminescence material, such as a quantum dot, a quantum rod, and a quantum tube. Hereinafter, an organic light emitting display panel will be described as an example of the light-emitting display panel according to exemplary embodiments of the invention.

A plurality of photolithography processes may be performed to form the scan lines SL1-SLn (refer to FIG. 1), the data lines DL1-DLm (refer to FIG. 1), the pixels $PX_{11}$-PXnm (refer to FIG. 1), the scan driving part SDC, and the data driving part DDC on a base substrate (not shown). A plurality of deposition or coating processes may be performed to form insulating layers on the base substrate (not shown). Each of the insulating layers may be a thin layer, which is provided to cover the entirety of the display panel DP, or at least one insulating pattern, which is overlapped with a portion of the display panel DP. The insulating layers may include at least one of inorganic or organic materials. In addition, an encapsulation layer (not shown) may be provided on the base substrate to protect the pixels $PX_{11}$-PXnm.

FIG. 2 illustrates an example of an equivalent circuit of a pixel PXij, which is connected to one of the scan lines SL1-SLn (e.g., i-th scan line SLi where i is a natural number) and one of the data lines DL1-DLm (e.g., j-th data line DLj where j is a natural number), but the invention is not limited thereto. The structure of the driving circuit may be variously changed from that of the pixel driving circuit shown in FIG. 2.

The pixel PXij may include an organic light emitting diode OLED and a pixel driving circuit, which is used to control the organic light emitting diode OLED. The pixel driving circuit may include a first TFT TR1, a second TFT TR2, and a capacitor CST.

The first TFT TR1 may include a control electrode, an input electrode, and an output electrode. The control electrode of the first TFT TR1 may be connected to an output electrode of the second TFT TR2 and a first capacitor electrode of the capacitor CST, an input electrode of the first TFT TR1 may be applied with the first power voltage ELVDD, and the output electrode of the first TFT TR1 may be connected to the organic light emitting diode OLED.

The first TFT TR1 may control an amount of a driving current passing through the organic light emitting diode OLED, based on an amount of electric charges stored in the capacitor CST. An operation time taken to turn on the first TFT TR1 may be dependent on an amount of electric charges stored in the capacitor CST. A voltage, which is supplied to the organic light emitting diode OLED through the output electrode of the first TFT TR1, may be lower than the first power voltage ELVDD. In exemplary embodiments, the first TFT TR1 may serve as a driving transistor.

The organic light emitting diode OLED may include a first electrode, which is connected to the first TFT TR1, and a second electrode, which is used to receive the second power voltage ELVSS. The organic light emitting diode OLED may include a light-emitting pattern provided between the first and second electrodes.

The organic light emitting diode OLED may emit light, when the first TFT TR1 is turned-on. Color (i.e., wavelength) of light emitted from the organic light emitting diode OLED may be determined by a material used for the light-emitting pattern. In an exemplary embodiment, the organic light emitting diode OLED may emit one of red, green, blue, and white lights. However, the invention is not limited thereto, and the organic light emitting diode OLED may emit various other colors.

The second TFT TR2 may include a control electrode, which is connected to the i-th scan line SLi, an input electrode, which is connected to the j-th data line DLj, and an output electrode. The second TFT TR2 may output a data signal, which is applied to the j-th data line DLj, in response to a scan signal applied to the i-th scan line SLi. In exemplary embodiments, the second TFT TR2 may serve as a control or switching transistor. Although FIG. 2 illustrates an example in which a single TFT is used as the control transistor, the invention is not limited thereto. In an exemplary embodiment, the control transistor may include one or more TFTs (e.g., five or six TFTs).

The capacitor CST may include the first capacitor electrode, which is connected to the second TFT TR2, and a second capacitor electrode, which is used to receive the first power voltage ELVDD. In exemplary embodiments, an amount of electric charges to be stored in the capacitor CST may be determined by a difference in voltage between a data signal, which is transmitted through the second TFT TR2, and the first power voltage ELVDD.

The invention may not be limited to the above embodiments. Various shapes of transistors may be used for the semiconductor device according to other exemplary embodiments of the invention.

Figure 3:
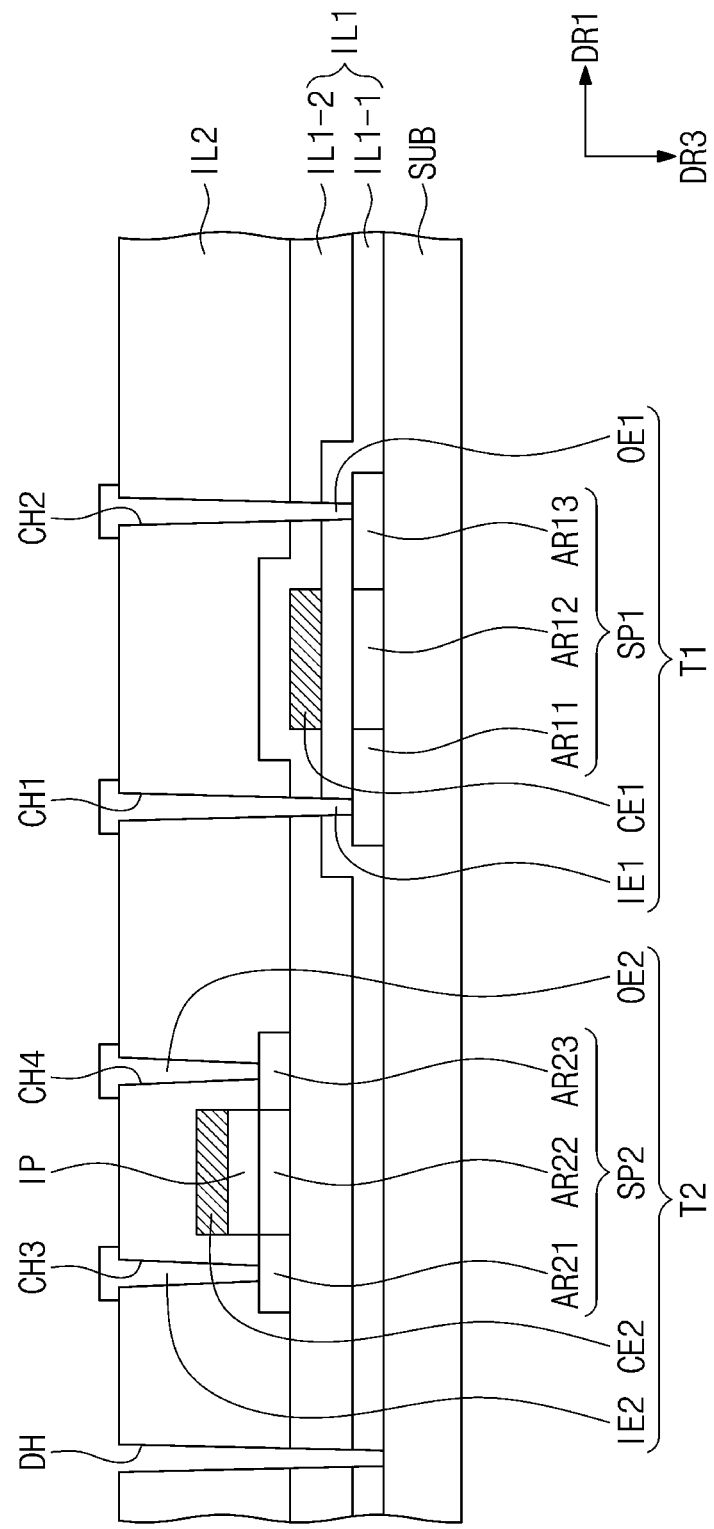
FIG. 3 is a cross-sectional view of an exemplary embodiment of a semiconductor device according to the invention.

FIG. 3 is a cross-sectional view of a semiconductor device according to an exemplary embodiment of the invention.

Referring to FIG. 3, a semiconductor device may include a base substrate SUB, a first TFT T1, a second TFT T2, and a plurality of insulating layers IL1 and IL2. Each of the first and second TFTs T1 and T2 may constitute one of the pixel driving circuits shown in FIG. 2. In an exemplary embodiment, the first TFT T1 may correspond to the first TFT TR1 of FIG. 2, and the second TFT T2 may correspond to the second TFT TR2 of FIG. 2. However, the invention is not limited to the exemplary embodiment.

Each of the first and second TFTs T1 and T2 may be provided on a top surface of the base substrate SUB, and the top surface of the base substrate SUB is defined by the first direction DR1 and the second direction DR2 (refer to FIG. 1). The plurality of insulating layers IL1 and IL2 may be provided on the top surface of the base substrate SUB.

Although FIG. 3 illustrates the first and second TFTs T1 and T2 spaced apart from each other in the first direction DR1, but the invention is not limited thereto.

Although FIG. 3 illustrates an example, in which a first control electrode CE1 is provided over a first semiconductor pattern SP1, the invention is not limited thereto. In addition, although FIG. 3 illustrates an example, in which a second control electrode CE2 is provided over a second semiconductor pattern SP2, the invention is not limited thereto. The description that follows will refer to an example, in which each of the first and second TFTs T1 and T2 has a so-called 'top-gate structure', but the invention is not limited thereto.

The first TFT T1 may include a first input electrode IE1, a first output electrode OE1, a first control electrode CE1, and a first semiconductor pattern SP1. The first TFT T1 may be a driving transistor, which is connected to an organic light emitting diode OLED (refer to FIG. 2), but the invention is not limited thereto.

The second TFT T2 may include a second input electrode IE2, a second output electrode OE2, a second control electrode CE2, and a second semiconductor pattern SP2. The second TFT T2 may serve as a control or switching transistor that is be used to control a switching operation of the pixel PXij (refer to FIG. 2). But the invention is not limited thereto, and in other exemplary embodiments, the second TFT T2 may serve as a driving transistor.

The base substrate SUB may be a layer, film, or plate, on which the first TFT T1, the second TFT T2, and the plurality of insulating layers IL1 and IL2 may be provided. In an exemplary embodiment, the base substrate SUB may be or include a plastic substrate, a glass substrate, a metal substrate, and so forth, for example. In an exemplary embodiment, the plastic substrate may include at least one of acrylic resins, methacrylic resins, polyisoprene resins, vinyl resins, epoxy resins, urethane resins, cellulose resins, siloxane resins, polyimide resins, polyamide resins, and perylene resins, for example.

The first semiconductor pattern SP1 may be formed of or include a crystalline semiconductor. In an exemplary embodiment, the first semiconductor pattern SP1 may be formed of or include a polycrystalline semiconductor material (e.g., poly silicon), for example.

The first semiconductor pattern SP1 may include a first region AR11 and a third region AR13, which are doped with impurities, and a second region AR12, which is positioned adjacent to, or between, the first and third regions AR11 and AR13. The two doped regions may include dopants. The first region AR11 may be coupled to the first input electrode IE1, and the third region AR13 may be coupled to the first output electrode OE1.

The second region AR12 may be provided between the first region AR11 and the third region AR13 and may be overlapped with the first control electrode CE1 in a plan view. The second region AR12 may be used as a channel region of the first TFT T1. The channel region of the first TFT T1 may be formed of or include a polycrystalline semiconductor material. Thus, the first TFT T1 may be used as a driving device with high mobility and high reliability. Hereinafter, the plan view may mean the semiconductor device is viewed in a thickness direction DR3.

The second semiconductor pattern SP2 may include at least one of oxide semiconductors. In an exemplary embodiment, the oxide semiconductors may include metal oxides, of which metallic element is at least one of zinc (Zn), indium (In), gallium (Ga), tin (Sn), or titanium (Ti), for example. As an example, the oxide semiconductors may include indium-tin oxide ("ITO"), indium-gallium-zinc oxide ("IGZO"), zinc oxide (ZnO), indium-zinc oxide (IZnO), zinc-indium oxide ("ZIO"), indium oxide (InO), titanium oxide (TiO), indium-zinc-tin oxide ("IZTO"), and zinc-tin oxide ("ZTO"). In exemplary embodiments, the second semiconductor pattern SP2 may include a crystallized oxide semiconductor. The crystallized oxide semiconductor may be provided to have a vertical directionality.

The second semiconductor pattern SP2 may include a first region AR21 and a third region AR23, which are doped with impurities, and a second region AR22, which is positioned adjacent to, or between, the first region AR21 and the third region AR23. The first region AR21 and the third region AR23 may be spaced apart from each other with the second region AR22 interposed therebetween. The first region AR21 may be coupled to the second input electrode IE2, and the third region AR23 may be coupled to the second output electrode OE2.

The second region AR22 may be overlapped with the second control electrode CE2 in a plan view. The second region AR22 may be used as a channel region of the second TFT T2. In exemplary embodiments, a reduced metallic material may be used as the impurities in the second semiconductor pattern SP2. The first region AR21 and the third region AR23 may include a metallic material reduced from the metal oxide of the second region AR22. This may make it possible to reduce a leakage current of the second TFT T2, and thus, the second TFT T2 may be used as a switching transistor with improved on/off characteristics.

The plurality of insulating layers IL1 and IL2 may include, for example, a first insulating layer ILL which is provided on the first semiconductor pattern SP1 and below the second semiconductor pattern SP2, and a second insulating layer IL2, which is provided on the second semiconductor pattern SP2, but the invention is not limited thereto. In another exemplary embodiment, when necessary, an additional insulating layer may be further provided, for example.

The first insulating layer IL1 may have a multi-layered structure including a plurality of layers. In the case where the first insulating layer IL1 has the multi-layered structure, the layers may include materials that are the same as each other or different from each other, according to technical requirements for the first insulating layer IL1. The first insulating layer IL1 may include a first sub-insulating layer IL1-1 and a second sub-insulating layer IL1-2, which are sequentially stacked on the base substrate SUB, but the invention is not limited thereto. In an exemplary embodiment, when necessary, an additional sub-insulating layer may be further provided, for example. As an example, the first sub-insulating layer IL1-1 may be provided on the base substrate SUB to cover at least a portion of the first semiconductor pattern SP1, and the second sub-insulating layer IL1-2 may be provided on the first sub-insulating layer IL1-1 to cover the first control electrode CE1.

The first insulating layer IL1 may be formed of or include at least one of inorganic materials or organic materials. In an exemplary embodiment, the first insulating layer IL1 may be formed of or include at least one of aluminum oxide, titanium oxide, silicon oxide, silicon oxynitride, zirconium oxide, or hafnium oxide, for example.

The second semiconductor pattern SP2 may be provided on the first insulating layer IL1. An insulating pattern IP may be provided on the second semiconductor pattern SP2 to expose a portion of the second semiconductor pattern SP2. The insulating pattern IP may be provided to cover the second region AR22 of the second semiconductor pattern SP2 and to expose the first and third regions AR21 and AR23 of the second semiconductor pattern SP2.

The second control electrode CE2 may be provided on the insulating pattern IP. The second control electrode CE2 may be overlapped with the insulating pattern IP in a plan view. In exemplary embodiments, the insulating pattern IP may be provided to have a side surface that is aligned to a side surface of the second control electrode CE2, and the side surface of the insulating pattern IP and the second control electrode CE2 may form a single vertical line. The border between the first region AR21 and the second region AR22 and the border between the second region AR22 and the third region AR23 may be respectively aligned to the side surfaces of the insulating pattern IP. The insulating pattern IP and the second control electrode CE2 may have the same shape in a plan view. The second control electrode CE2 may be in contact with the insulating pattern IP in a plan view.

The second insulating layer IL2 may be provided on the first insulating layer IL1 to cover at least a portion of the second semiconductor pattern SP2, the insulating pattern IP, and the second control electrode CE2. The second insulating layer IL2 may be provided to have a single- or multi-layered structure.

The second insulating layer IL2 may include at least one of inorganic or organic materials. In an exemplary embodiment, the second insulating layer IL2 may include at least one of inorganic materials (e.g., aluminum oxide, titanium oxide, silicon oxide, silicon oxynitride, zirconium oxide, and hafnium oxide), for example, but the invention is not limited thereto.

At least one dummy hole DH may be defined in the first insulating layer IL1 and the second insulating layer IL2 such that the least one dummy hole DH penetrates the first insulating layer IL1 and the second insulating layer IL2. The dummy hole DH may not be overlapped with the first TFT T1 and the second TFT T2 in a plan view. The dummy hole DH may be used to outgas hydrogen, which may serve as charge carriers into the second semiconductor pattern SP2, to the outside. In other words, the dummy hole DH may be used as an outgassing hole, allowing the hydrogen to be outgassed from the second semiconductor pattern SP2.

In a plan view, the dummy hole DH may be closer to the second semiconductor pattern SP2 than to the first semiconductor pattern SP1. A distance between the dummy hole DH and the second semiconductor pattern SP2 will be described below.

FIG. 4 is a cross-sectional view of a semiconductor device according to an exemplary embodiment of the invention.

Referring to FIG. 4, the semiconductor device may further include a buffer layer BF that is provided between the base substrate SUB and the first semiconductor pattern SP1. However, the invention is not limited thereto, and the structure of the semiconductor device may be variously changed depending on its kind. The buffer layer BF may be used to enhance a bonding strength between the base substrate SUB and the first semiconductor pattern SP1. The buffer layer BF may include at least one of inorganic or organic materials. Although not shown, a barrier layer may be further provided on the top surface of the base substrate SUB and may be used to block a foreign substance from the outside. In exemplary embodiments, each of the buffer layer BF and the barrier layer may be provided or omitted, in consideration of the kind or purpose of the semiconductor device.

In addition to the at least one dummy hole DH, holes may be defined in the plurality of insulating layers IL1 and IL2. In an exemplary embodiment, a first through hole CH1 and a second through hole CH2, which are spaced apart from each other, may be defined to penetrate the first insulating layer IL1 and the second insulating layer IL2, for example. The first input electrode IE1 may be in contact with the first semiconductor pattern SP1 through the first through hole CH1, and the first output electrode OE1 may be in contact with the first semiconductor pattern SP1 through the second through hole CH2. In an exemplary embodiment, the first input electrode IE1 may be in contact with the first region AR11 of the first semiconductor pattern SP1 through the first through hole CH1, and the first output electrode OE1 may be in contact with the third region AR13 of the first semiconductor pattern SP1 through the second through hole CH2, for example.

A third through hole CH3 and a fourth through hole CH4, which are spaced apart from each other, may be defined to penetrate the second insulating layer IL2. The second input electrode IE2 may be in contact with the second semiconductor pattern SP2 through the third through hole CH3, and the second output electrode OE2 may be in contact with the second semiconductor pattern SP2 through the fourth through hole CH4. In an exemplary embodiment, the second input electrode IE2 may be in contact with the first region AR21 of the second semiconductor pattern SP2 through the third through hole CH3, and the second output electrode OE2 may be in contact with the third region AR23 of the second semiconductor pattern SP2 through the fourth through hole CH4, for example.

The first through hole CH1, the second through hole CH2, the third through hole CH3, and the fourth through hole CH4 may be filled with a conductive material. In exemplary embodiments, a portion or the entirety of the dummy hole DH may not be filled with a conductive material. Although not shown, at least a portion of the dummy hole DH may be filled with an insulating material. In an exemplary embodiment, at least a portion of the dummy hole DH may be filled with the same material as that of the layer provided on the second insulating layer IL2, for example, but the invention is not limited thereto. A portion or the entirety of the dummy hole DH may not be filled with any solid material.

During the process of fabricating a semiconductor device, hydrogen may be produced from the first insulating layer IL1. To prevent the hydrogen from being diffused into the second semiconductor pattern SP2, the at least one dummy hole DH may be defined to penetrate not only the second insulating layer IL2 but also the first insulating layer IL1. In an exemplary embodiment, the at least one dummy hole DH may be defined to penetrate both of the first and second insulating layers IL1 and IL2, and in this case, the at least one dummy hole DH may be used to effectively exhaust the hydrogen to the outside, for example.

Thus, a distance D1 between a bottom end of the dummy hole DH and a top surface of the base substrate SUB may be smaller than a distance D2 between a bottom end of the first through hole CH1 and the top surface of the base substrate SUB. The distance D1 may be smaller than a distance D3 between a bottom end of the second through hole CH2 and the top surface of the base substrate SUB. The distance D1 may be smaller than a distance D4 between a bottom end of the third through hole CH3 and the top surface of the base substrate SUB. The distance D1 may be smaller than a distance D5 between a bottom end of the fourth through hole CH4 and the top surface of the base substrate SUB.

In exemplary embodiments, defining the at least one dummy hole DH may be performed using the process of defining the first through hole CH1 and the second through hole CH2. That is, it may be possible to define the at least one dummy hole DH, without addition of a process step.

Figure 5A:
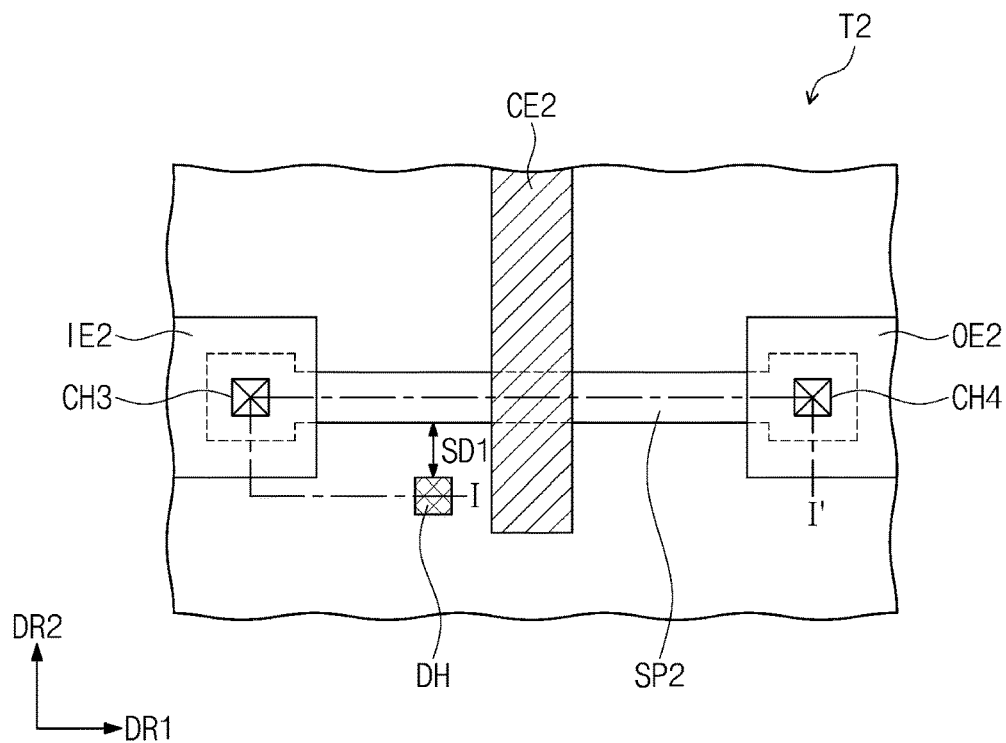
FIG. 5A is a plan view illustrating an exemplary embodiment of a portion of a second thin-film transistor ("TFT") which is used as a part of a semiconductor device according to the invention.
Figure 5B:
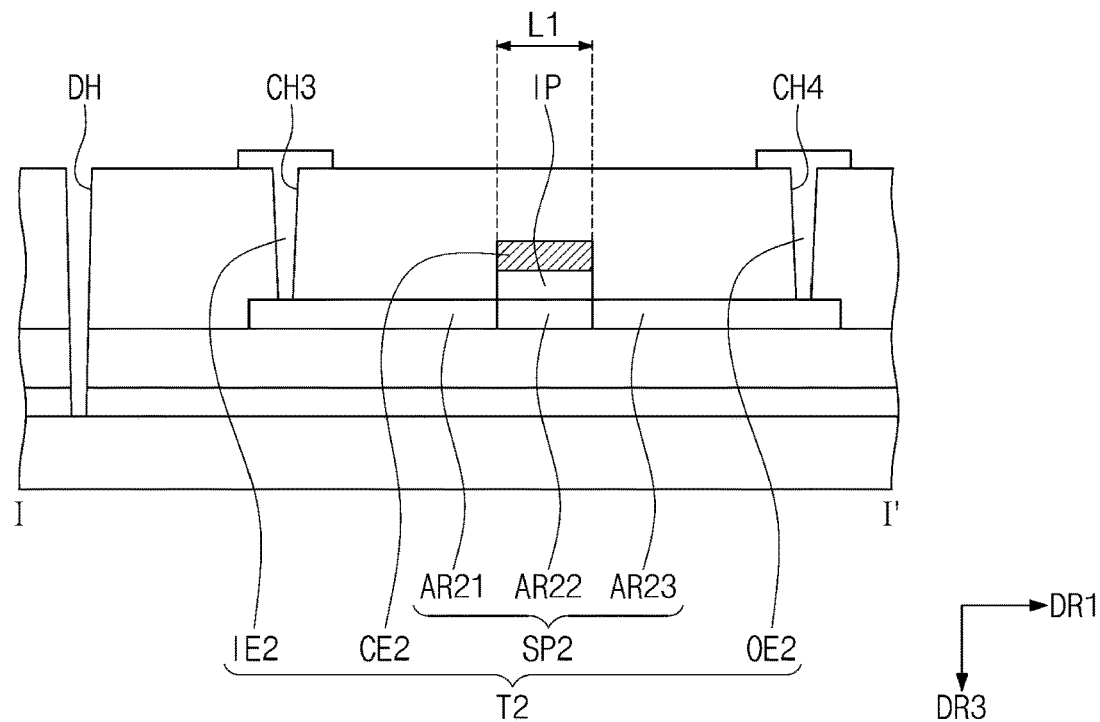
FIG. 5B is a cross-sectional view taken along line I-I' of FIG. 5A.

FIG. 5A is a plan view illustrating a portion of a second TFT which is used as a part of a semiconductor device according to an exemplary embodiment of the invention. FIG. 5B is a cross-sectional view taken along line I-I' of FIG. 5A.

Referring to FIGS. 5A and 5B, the shortest distance SD1 between the at least one dummy hole DH and the second semiconductor pattern SP2 may be equal to or smaller than 5 micrometers (μm), for example, when measured in a plan view. In the case where the holes are randomly defined without consideration of the distance between the at least one dummy hole DH and the second semiconductor pattern SP2, the holes may not serve as the desired outgassing hole. In the case where the shortest distance SD1 is larger than 5 μm, for example, it may be difficult to effectively exhaust hydrogen to the outside through the at least one dummy hole DH, and thus, a non-negligible fraction of hydrogen may be diffused into the second semiconductor pattern SP2. The shortest distance SD1 may be provided to be equal to or smaller than 5 μm, regardless of a length of the second semiconductor pattern SP2.

In an exemplary embodiment, a length L1 of the channel region AR22 of the second semiconductor pattern SP2 may be equal to or shorter than 2 μm, for example. The length L1 may be a length of the channel region AR22 in the first direction DR1. As described above, the channel region AR22 of the second semiconductor pattern SP2 may be the second region AR22 of the second semiconductor pattern SP2.

In the case where, in a plan view, the shortest distance SD1 is shorter than 5 μm, the at least one dummy hole DH may be used for an effective outward diffusion of hydrogen, and thus, this may make it possible to reduce the length L1 of the channel region AR22 of the second semiconductor pattern SP2. In an exemplary embodiment, even when there is no change in an amount of hydrogen to be absorbed in the channel region AR22 of the second semiconductor pattern SP2, the smaller the length L1 of the channel region AR22 of the second semiconductor pattern SP2, the higher the concentration of the hydrogen, for example. Accordingly, when the length L1 of the channel region AR22 of the second semiconductor pattern SP2 is reduced, the transistor may be more vulnerable to hydrogen serving as a carrier. In a semiconductor device according to exemplary embodiments of the invention, the at least one dummy hole DH may be defined in such a way that the shortest distance SD1 is equal to or less than 5 μm, and thus, it may be possible to prevent or suppress the above problem, even when the length L1 of the channel region AR22 of the second semiconductor pattern SP2 is reduced.

The shorter the length L1 of the channel region AR22 of the second semiconductor pattern SP2, the more advantageous to realize a high resolution semiconductor device, when the length L1 is equal to or shorter than 2 μm. In an exemplary embodiment, the length L1 of the channel region AR22 of the second semiconductor pattern SP2 may be equal to or shorter than 1.5 μm, 1.3 μm, or 1 μm, for example.

In a plan view, the shortest distance SD1 may be equal to or shorter than 3 μm (in particular, equal to or shorter than 2.5 μm). In the case where, in a plan view, the shortest distance SD1 is equal to or shorter than 5 μm, the shorter the shortest distance SD1, the better the semiconductor device, but considering a process variation, 1 μm may be selected as the lowest limit of the shortest distance SD1. However, the invention is not limited thereto.

The at least one dummy hole DH may be defined in the plurality of insulating layers IL1 and IL2 (refer to FIG. 3) so as to satisfy the following inequality 1.

$$2\ \mu m \times 2\ \mu m \leq X\ \mu m^2 \leq 2\ \mu m \times Y\ \mu m, \qquad \text{[Inequality 1]}$$

where X is a total planar area of the at least one dummy hole DH and Y is a length of the second semiconductor pattern SP2. In an exemplary embodiment, in the case where there are a plurality of dummy holes DH, X is the sum of planar areas of the dummy holes DH and Y is a length of the second semiconductor pattern SP2 measured in the first direction DR1, for example. When the area X satisfies the inequality 1, the larger the area X, the better the semiconductor device, but the invention is not limited thereto.

When the inequality 1 is satisfied, the role of the at least one dummy hole DH as the outgassing hole may be more effectively achieved, and moreover, it may be possible to improve uniformity in electrical characteristics of the second TFT T2.

The at least one dummy hole DH may be defined in the plurality of insulating layers IL1 and IL2 (refer to. FIG. 3) so as to satisfy the following inequality 2.

$$2\ \mu m \times 2\ \mu m \leq X\ \mu m^2 \leq 2\ \mu m \times Z\ \mu m, \qquad \text{[Inequality 2]}$$

where X is the same as that of the inequality 1 and Z is a distance between the third and fourth contact holes CH3 and CH4. The distance Z may be the shortest distance between the third and fourth contact holes CH3 and CH4 in the first direction DR1.

When the inequality 2 is satisfied, the role of the at least one dummy hole DH as the outgassing hole may be more effectively achieve, and moreover, it may be possible to improve uniformity in electrical characteristics of the second TFT T2.

FIGS. 3, 4, 5A, and 5B illustrate an example, in which a single dummy hole DH is defined, but the invention is not limited thereto.

Figure 6:
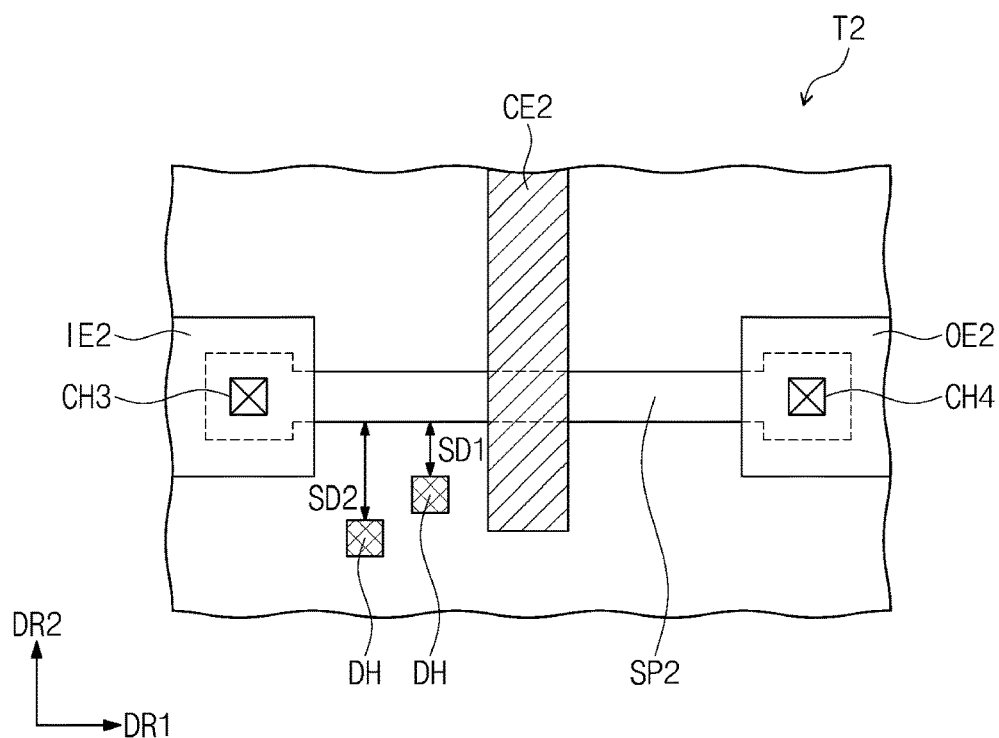
FIG. 6 is a plan view illustrating an exemplary embodiment of a portion of a second TFT which is used as a part of a semiconductor device according to the invention.
Figure 7:
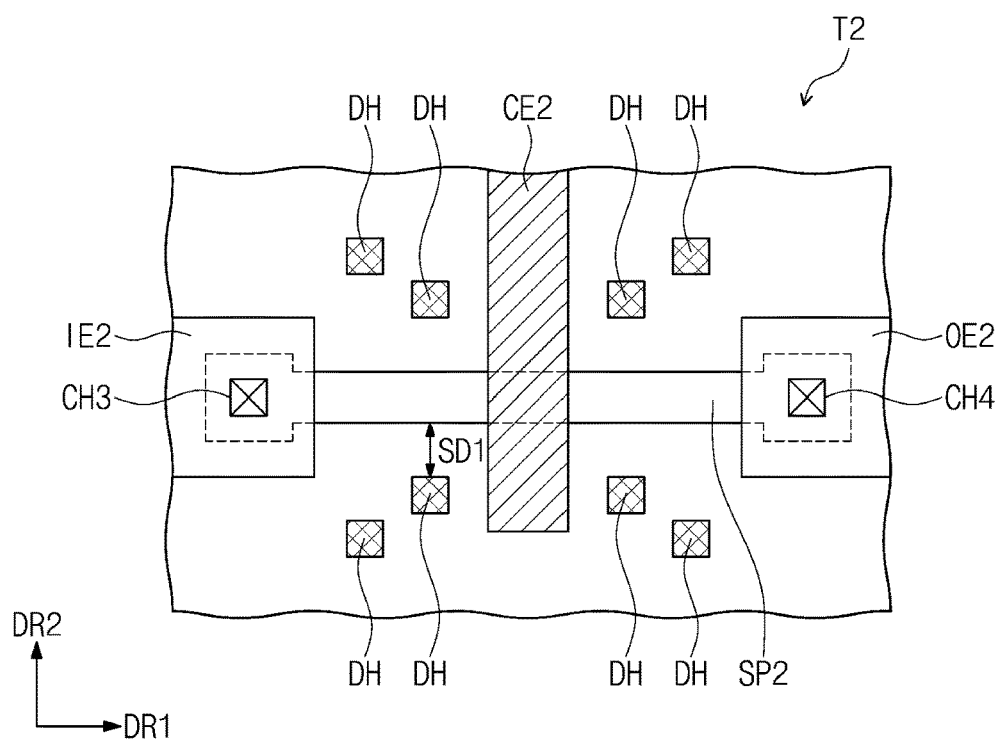
FIG. 7 is a plan view illustrating an exemplary embodiment of a portion of a second TFT which is used as a part of a semiconductor device according to the invention.
Figure 8:
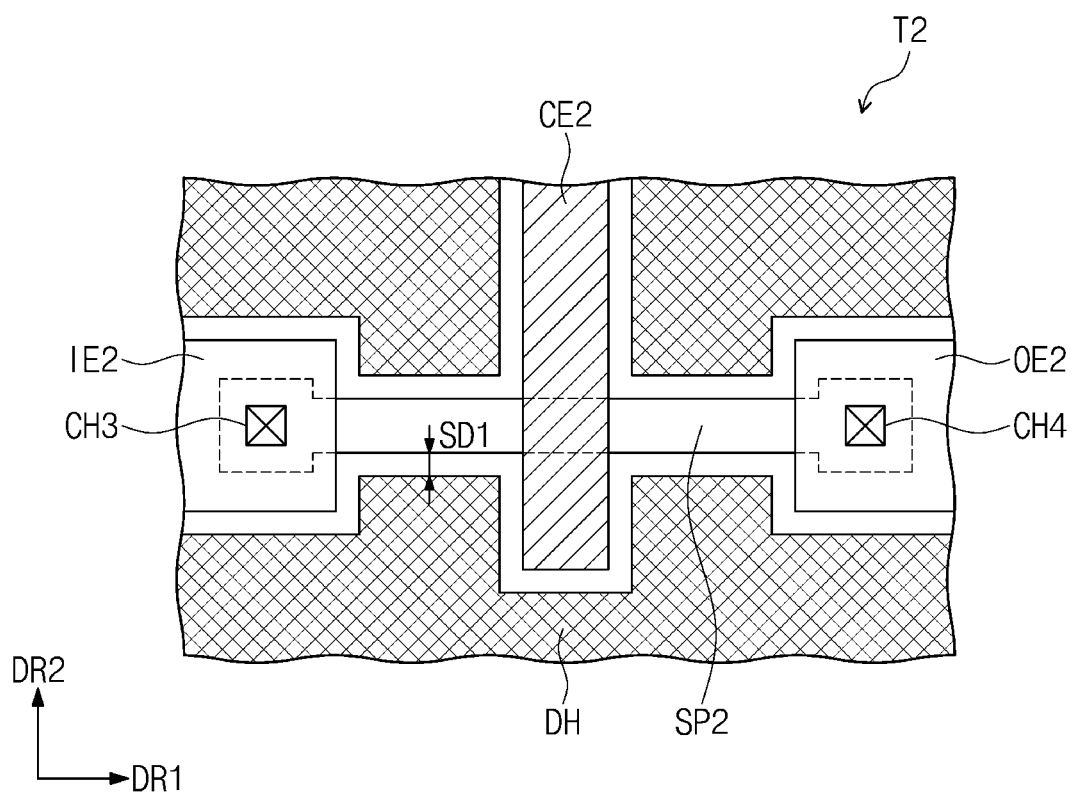
FIG. 8 is a plan view illustrating an exemplary embodiment of a portion of a second TFT which is used as a part of a semiconductor device according to the invention.

FIG. 6 is a plan view illustrating a portion of a second TFT which is used as a part of a semiconductor device according to an exemplary embodiment of the invention. FIG. 7 is a plan view illustrating a portion of a second TFT which is used as a part of a semiconductor device according to an exemplary embodiment of the invention. FIG. 8 is a plan view illustrating a portion of a second TFT which is used as a part of a semiconductor device according to an exemplary embodiment of the invention.

Referring to FIGS. 6 to 8, at least one dummy hole DH may be defined in various shapes, in the plurality of insulating layers IL1 and IL2 (refer to FIG. 3). In an exemplary embodiment, a plurality of dummy holes DH spaced apart from each other may be defined. As shown in FIG. 6, in the case where a plurality of dummy holes DH is defined, distances between the second semiconductor pattern SP2 and the dummy holes DH may have at least two different values (e.g., SD1 and SD2) in a plan view. Even in this case, the shortest distance (e.g., SD1) may be equal to or shorter than 5 μm, and preferably, it may be equal to or shorter than 3 μm. More preferably, the shortest distance (e.g., SD1) may be about 2.5 μm. As shown in FIG. 7, the at least one dummy hole DH may be regularly arranged in a plan view, but the invention is not limited thereto. As described above, it may be preferred to have a large planar area of the dummy hole DH, when the area is within a specific range, and the dummy hole DH may be defined to have a shape shown in FIG. 8.

In a plan view, the shape of the dummy hole DH may not be limited to a specific shape. In an exemplary embodiment, the dummy hole DH may be provided to have various shapes such as a polygonal, circular, or elliptical shape.

Figure 9:
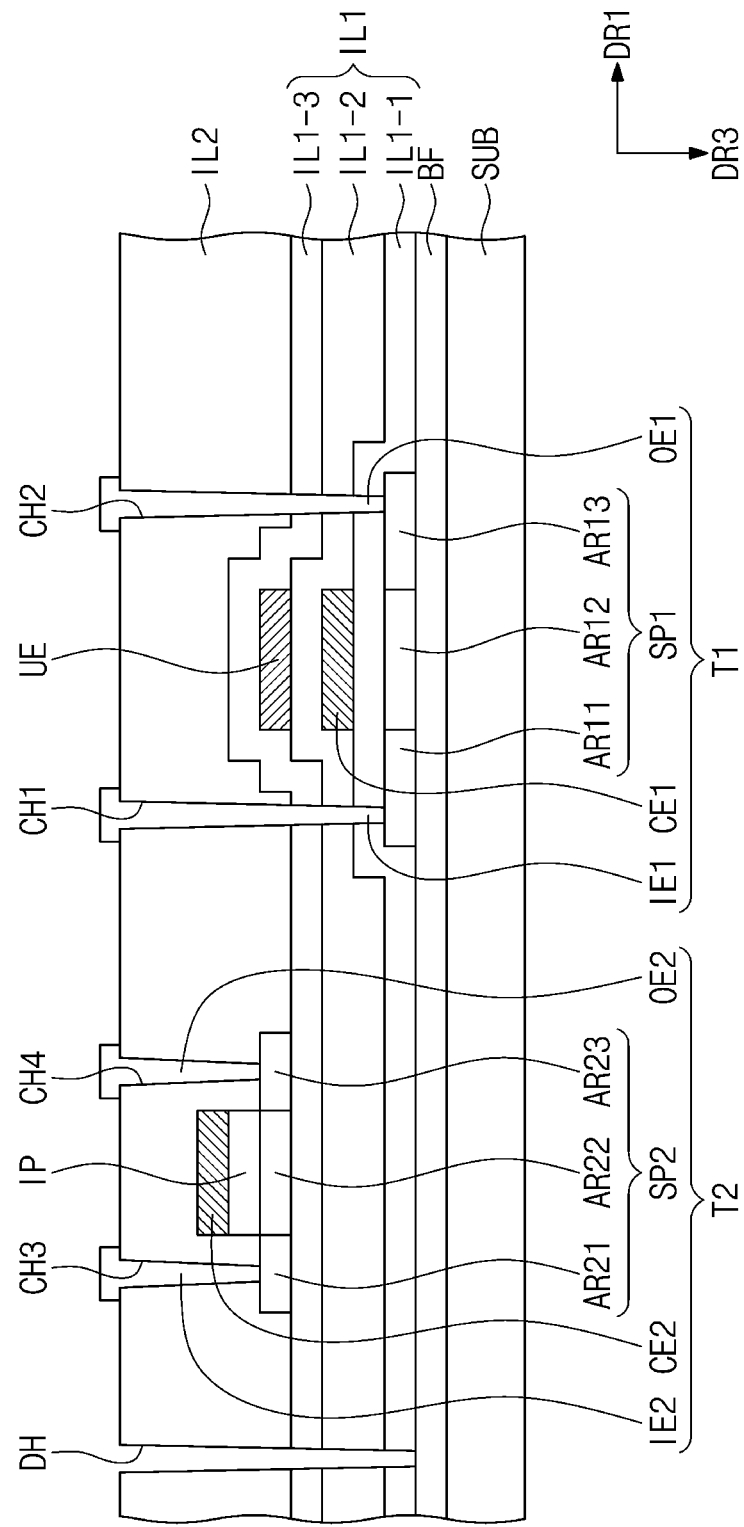
FIG. 9 is a cross-sectional view illustrating an exemplary embodiment of a semiconductor device according to the invention.

FIG. 9 is a cross-sectional view illustrating a semiconductor device according to an exemplary embodiment of the invention.

A semiconductor device may include a capacitor, which is overlapped with the first TFT T1, but the invention is not limited thereto. Referring to FIG. 9, the semiconductor device may further include an upper electrode UE provided on the second sub-insulating layer IL1-2, and the capacitor may be defined by the first control electrode CE1 and the upper electrode UE. The first control electrode CE1 and the upper electrode UE may be overlapped with each other in a plan view, and may be used to generate an electric field therebetween. The first control electrode CE1 may be used not only as a part of the first TFT T1 but also as an electrode of the capacitor CST (refer to FIG. 2). The capacitor defined by the first control electrode CE1 and the upper electrode UE may correspond to the capacitor CST of FIG. 2, but the invention is not limited thereto. In an exemplary embodiment, a capacitor may be provided to be spaced apart from each of the first and second TFTs T1 and T2 in the first direction DR1, for example.

As described above, when necessary, the first insulating layer IL1 may further include a sub-insulating layer, in addition to the first sub-insulating layer IL1-1 and the second sub-insulating layer IL1-2. In an exemplary embodiment, the first insulating layer IL1 may further include a third sub-insulating layer IL1-3, which is provided on the second sub-insulating layer IL1-2 to cover at least a portion of the upper electrode UE, for example. The third sub-insulating layer IL1-3 may be provided below the second semiconductor pattern SP2.

Figure 10:
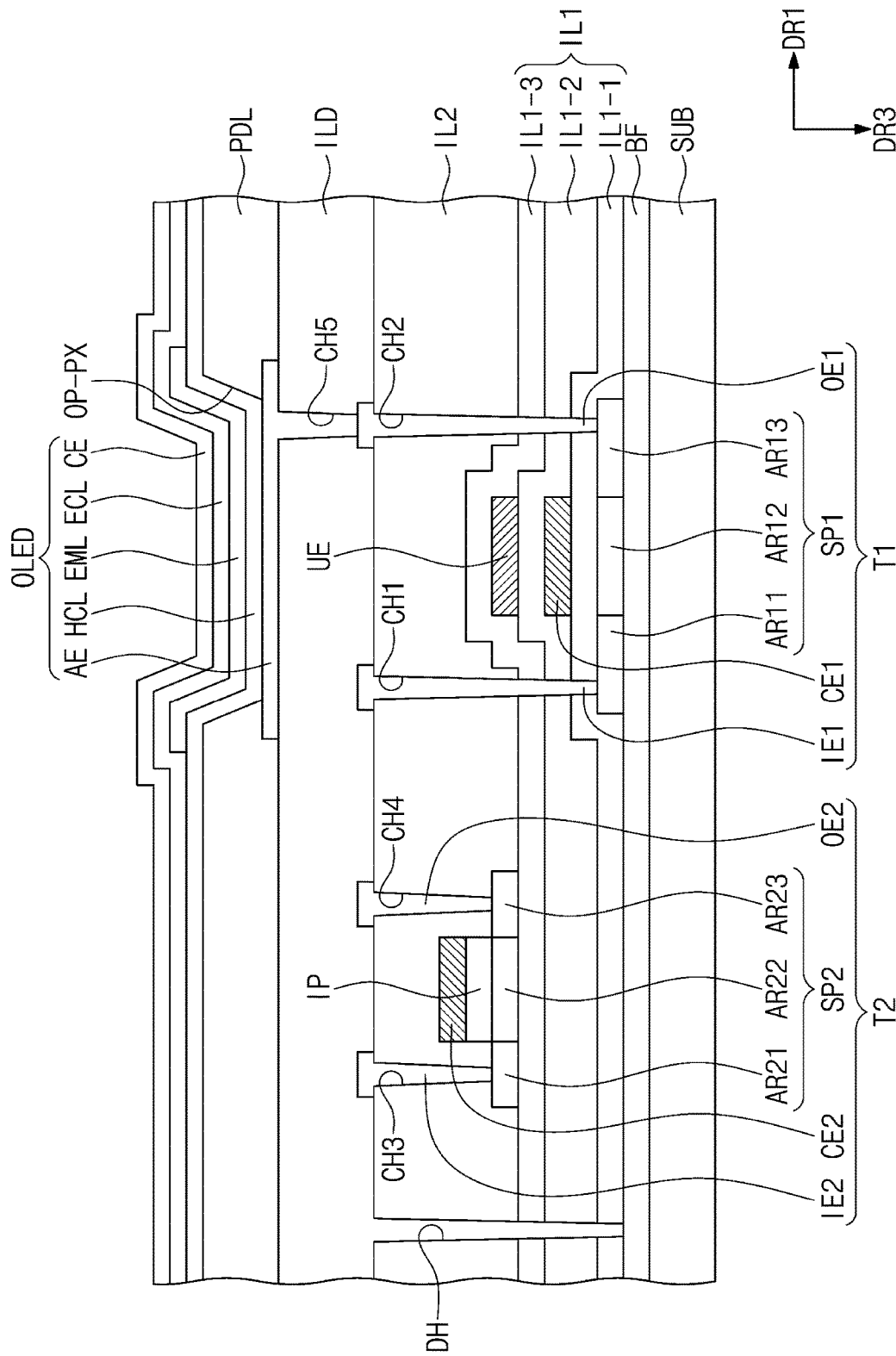
FIG. 10 is a cross-sectional view illustrating an exemplary embodiment of a semiconductor device according to the invention.

FIG. 10 is a cross-sectional view illustrating a semiconductor device according to an exemplary embodiment of the invention.

Referring to FIG. 10, as described above, a semiconductor device may further include a light-emitting diode OLED. The organic light emitting diode OLED may be connected to the first TFT T1.

The organic light emitting diode OLED may include an anode AE, a cathode CE, and an organic layer, which is interposed between the anode AE and the cathode CE. The organic layer may include a first charge control layer HCL, a light emitting layer EML, a second charge control layer ECL.

The semiconductor device may further include an interlayered insulating layer ILD provided on a second insulating layer IL2. The interlayered insulating layer ILD may be formed of or include at least one of inorganic or organic materials. The interlayered insulating layer ILD may be provided such that a fifth through hole CH5 penetrating the insulating layer ILD is defined. The fifth through hole CH5 may be overlapped with the first output electrode OE1 in a plan view.

The anode AE may be provided on the interlayered insulating layer ILD. The anode AE may be coupled to the first output electrode OE1 of the first TFT T1 via the fifth through hole CH5.

A pixel defining layer PDL may be placed on the interlayered insulating layer ILD. The pixel defining layer PDL may include at least one of organic or inorganic layers. An opening OP-PX may be defined in the pixel defining layer PDL. The opening OP-PX may be defined to expose at least a portion of the anode AE.

The first charge control layer HCL, the light emitting layer EML, the second charge control layer ECL, and the cathode CE may be sequentially stacked on the anode AE. The light emitting layer EML may be a light-emitting pattern, which is overlapped with the opening OP-PX. The first charge control layer HCL may be a hole transport region, and the second charge control layer ECL may be an electron transport region. In the organic light emitting diode OLED, the light emitting layer EML may generate light using a difference in voltage between the anode AE and the cathode CE. Although not shown, a display device according to exemplary embodiments of the invention may further include at least one of organic or inorganic layers provided on the cathode CE.

Hereinafter, a semiconductor device according to exemplary embodiments of the invention will be described. For the sake of brevity, the elements and features of this example that are similar to those previously shown and described will not be described in much further detail.

Referring to FIGS. 3 to 10, a semiconductor device may include the base substrate SUB, the first TFT T1, the second TFT T2, the first insulating layer IL1 and the second insulating layer IL2. Unless otherwise stated, the base substrate SUB, the first TFT T1, the second TFT T2, the first insulating layer IL1 and the second insulating layer IL2 may have the same features as those previously shown and described.

In an exemplary embodiment, the first insulating layer IL1 may be provided on the first semiconductor pattern SP1 constituting the first TFT T1 and below the second semiconductor pattern SP2 constituting the second TFT T2, for example. The second insulating layer IL2 may be provided on the second semiconductor pattern SP2 constituting the second TFT T2. The first insulating layer IL1 may have a multi-layered structure, and the second insulating layer IL2 may have a single- or multi-layered structure.

The first insulating layer IL1 and the second insulating layer IL2 may be such that at least one dummy hole DH penetrating the first insulating layer IL1 and the second insulating layer IL2 is defined. The at least one dummy hole DH may be used as an outgassing hole for exhausting hydrogen, which may be produced in a process of fabricating a semiconductor device. The hydrogen may be produced from the first insulating layer ILL during the fabrication process, but the invention is not limited thereto.

In a plan view, the at least one dummy hole DH may not be overlapped with the first TFT T1 and the second TFT T2 and may be defined to be closer to the second semiconductor pattern SP2 than to the first semiconductor pattern SP1. In an exemplary embodiment, in a plan view, the shortest distance SD1 between the at least one dummy hole DH and the second semiconductor pattern SP2 may be equal to or shorter than 5 µm (preferably 3 µm and more preferably 2.5 µm) and may be equal to or larger than 1 µm. In exemplary embodiments, the at least one dummy hole DH may be defined to satisfy the above inequality 1 or 2.

The at least one dummy hole DH may not be filled with a conductive material, and in exemplary embodiments, it may not be filled with any solid material. However, the invention is not limited thereto. In an exemplary embodiment, at least a portion of the dummy hole DH may be filled with an insulating material, for example. The dummy hole DH may be at least partially filled with the same material as the layer provided on the second insulating layer IL2.

Hereinafter, comparison between an example embodiment and comparative examples will be presented to provide better understanding of the invention. The exemplary embodiment described below is one of many possible exemplary embodiments of the invention, and the invention is not limited thereto.

Example Embodiment 1

A semiconductor device was fabricated in such a way that one dummy hole DH was defined in a plurality of insulating layers IL1 and IL2. In a plan view, a distance between the dummy hole DH and the second semiconductor pattern SP2 was about 2.5 µm and an area of the dummy hole DH was about 4 µm².

Comparative Example 1

Four dummy holes DH were defined in a plurality of insulating layers IL1 and IL2. In a plan view, the shortest distance SD1 between the dummy hole DH and the second semiconductor pattern SP2 was equal to or shorter than about 20 µm and an area of each of the dummy holes DH was about 4 µm². Except for the aforementioned features, the semiconductor device of the comparative example 1 was fabricated to be substantially the same as that of the example embodiment 1.

Comparative Example 2

The dummy hole DH was not defined in a plurality of insulating layers IL1 and IL2. Except for the aforementioned feature, the semiconductor device of the comparative example 2 was fabricated to be substantially the same as that of the example embodiment 1.

Current-voltage characteristics of the semiconductor devices according to the comparative examples 1 and 2 and the example embodiment 1 will be described with reference to FIGS. 11A to 11C.

Figure 11A:
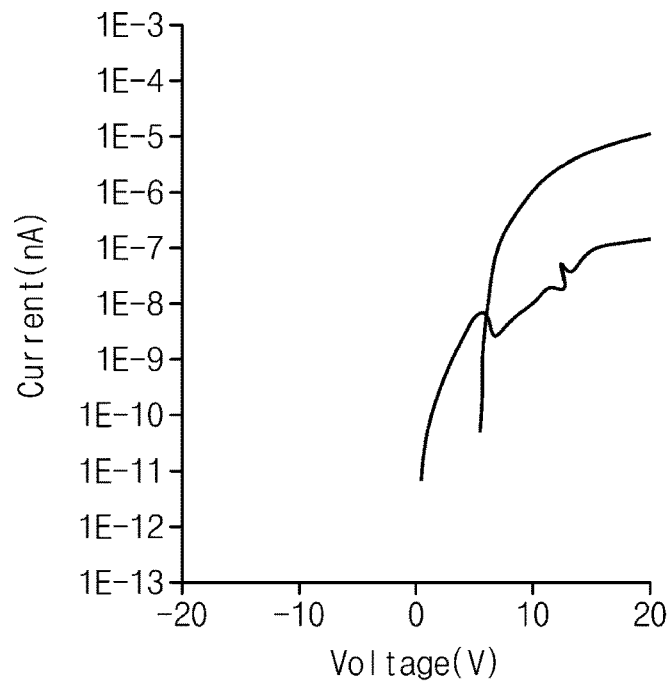
FIG. 11A is a graph showing current-voltage characteristics of a semiconductor device according to a comparative example 1.

When, in a plan view, the shortest distance SD1 between the dummy hole DH and the second semiconductor pattern SP2 did not satisfy the condition of less-than 5 µm, the threshold voltage was non-uniform as shown in FIG. 11A. This was likely to be because, although the dummy hole DH was provided, it was difficult to exhaust hydrogen through the dummy hole DH, when a distance between the dummy hole DH and the second semiconductor pattern SP2 was not considered.

Figure 11B:
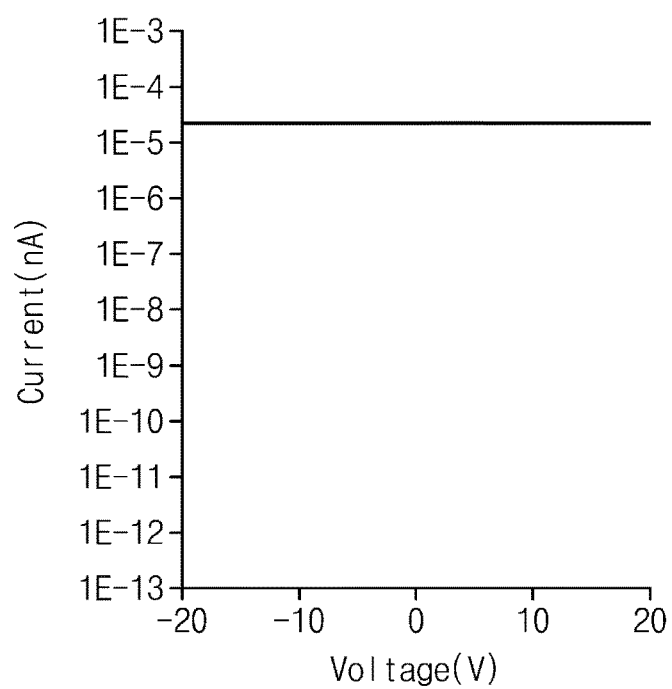
FIG. 11B is a graph showing current-voltage characteristics of a semiconductor device according to a comparative example 2.

When the dummy hole DH was not provided, a short circuit occurred in the semiconductor device, as shown in FIG. 11B. Since the dummy hole DH is used to exhaust hydrogen to the outside, the absence of the dummy hole DH may lead to an increase of hydrogen to be absorbed in the second semiconductor pattern SP2. The short circuit may be interpreted as being caused by the increase of hydrogen, in that hydrogen may serve as charge carriers.

Figure 11C:
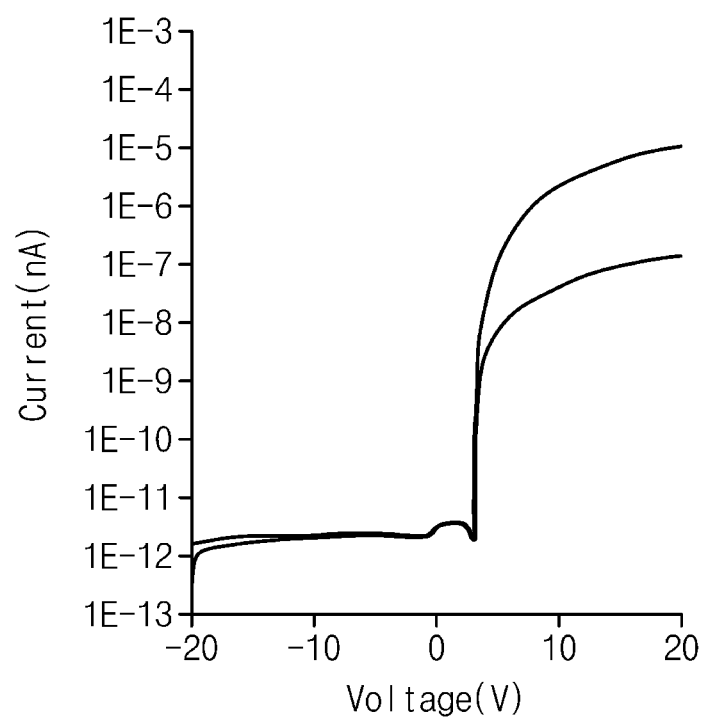
FIG. 11C is a graph showing current-voltage characteristics of an exemplary embodiment of a semiconductor device according to the invention.

When, as shown in FIG. 11C, the dummy hole DH was defined in such a way that the shortest distance SD1 to the second semiconductor pattern SP2 was equal to or shorter than 5 µm in a plan view, it was possible to achieve a constant threshold voltage.

According to exemplary embodiments of the invention, a semiconductor device may be provided to have a dummy hole near a semiconductor pattern. The semiconductor pattern may be provided to include an oxide semiconductor, which is vulnerable to hydrogen, but the dummy hole may be used to exhaust such hydrogen from the semiconductor pattern. Thus, it may be possible to prevent or suppress failures caused by the hydrogen. In particular, a distance between the dummy hole and the semiconductor pattern may be determined to efficiently realize the role of the dummy hole as an outgassing hole, and thus, it may be possible to prevent or suppress the semiconductor pattern from being affected by the hydrogen.

In detail, hydrogens may be produced in a process of fabricating a semiconductor device. The hydrogens may be absorbed in a semiconductor pattern including an oxide semiconductor material, thereby serving as electric carriers, or may be used to fill oxygen vacancies in the oxide semiconductor material and thereby to prevent deterioration in electric characteristics of the semiconductor device. In the case where the hydrogens are used as the carriers, they may be easily exhausted to the outside through the dummy hole DH, rather than absorbed in the semiconductor pattern, and thus, the most of such hydrogens may be exhausted through the dummy hole DH. By contrast, in the case where the hydrogens are used to fill the oxygen vacancies, they may be used to fill or cure the oxygen vacancies, rather than exhausted through the dummy hole DH, and thus, it may be difficult to exhaust such hydrogens through the dummy hole DH.

That is, the dummy hole DH may be used to exhaust the most of hydrogens, which are absorbed in the semiconductor pattern including the oxide semiconductor material, and thus, it may be possible to prevent technical issues (e.g., the non-constancy of the threshold voltage or the occurrence of the short circuit), which may be caused by the hydrogen.

In other words, according to exemplary embodiments of the invention, it may be possible to easily and efficiently control a threshold voltage of a semiconductor device, without an additional compensation circuit.

According to exemplary embodiments of the invention, it may be possible to easily control threshold voltage characteristics of a semiconductor device, and in particular, to realize high uniformity in threshold voltage characteristics.

According to exemplary embodiments of the invention, a semiconductor device may reduce an amount of hydrogens to be absorbed in an oxide semiconductor pattern. This may make it possible to prevent or suppress hydrogen-caused defects, because the hydrogens are used as electric carriers in the oxide semiconductor pattern. Furthermore, this may make it possible to use a short oxide semiconductor pattern in a semiconductor device and thereby to increase resolution of the semiconductor device.

While exemplary embodiments of the inventions have been particularly shown and described, it will be understood by one of ordinary skill in the art that variations in form and detail may be made therein without departing from the spirit and scope of the attached claims.

What is claimed is:

1. A semiconductor device, comprising:
a base substrate;
a plurality of gate lines;
a first thin-film transistor which is provided on the base substrate, and includes a first input electrode, a first output electrode, a first control electrode, and a first semiconductor pattern including a crystalline semiconductor material;
a second thin-film transistor which is provided on the base substrate, and includes a second input electrode, a second output electrode, a second control electrode directly connected to a gate line of the plurality of gate lines, and a second semiconductor pattern including an oxide semiconductor material; and
a plurality of insulating layers provided on the base substrate to define at least one dummy hole which is not overlapped with the first and second thin-film transistors,
wherein the plurality of insulating layers comprises a first insulating layer provided on the first semiconductor pattern and below the second semiconductor pattern;
wherein a shortest distance between the at least one dummy hole and the second semiconductor pattern is equal to or shorter than 5 micrometers, in a plan view, and
wherein the at least one dummy hole is not filled with a conductive material and provided to meet following inequality 1:

$$2 \text{ micrometers} \times 2 \text{ micrometers} \leq X \text{ micrometer}^2 \leq 2 \text{ micrometers} \times Y \text{ micrometer}, \quad \text{[Inequality 1]}$$

where X is a total planar area of the at least one dummy hole, and
Y is a length of the second semiconductor pattern, wherein Y is equal to or shorter than about 20 micrometers.

2. The semiconductor device of claim 1, wherein the shortest distance is equal to or shorter than 2.5 micrometers.

3. The semiconductor device of claim 1, wherein at least a portion of the at least one dummy hole is filled with an insulating material.

4. The semiconductor device of claim 1, wherein the plurality of insulating layers further comprises:
a second insulating layer provided on the second semiconductor pattern, wherein the at least one dummy hole is defined to penetrate the first insulating layer and the second insulating layer.

5. The semiconductor device of claim 4, wherein the first insulating layer has a multi-layered structure.

6. The semiconductor device of claim 1, wherein the first input electrode and the first output electrode are in contact with the first semiconductor pattern via a first through hole and a second through hole, respectively, and
the second input electrode and the second output electrode are in contact with the second semiconductor pattern via a third through hole and a fourth through hole, respectively.

7. The semiconductor device of claim 6, wherein a distance between a bottom end of the at least one dummy hole and a top surface of the base substrate is smaller than a distance between a bottom end of each of the first, second, third, and fourth through holes and the top surface of the base substrate.

8. The semiconductor device of claim 1, wherein a length of a channel region of the second semiconductor pattern is equal to or shorter than 2 micrometers.

9. The semiconductor device of claim 1, further comprising a light-emitting diode connected to the first thin-film transistor.

10. The semiconductor device of claim 1, further comprising:
a plurality of data lines; and
wherein the second input electrode directly connected to a data line of the plurality of data lines.

11. A semiconductor device, comprising:
a base substrate;
a plurality of gate lines;
a first thin-film transistor which is provided on the base substrate, and includes a first input electrode, a first output electrode, a first control electrode, and a first semiconductor pattern including a crystalline semiconductor material;
a second thin-film transistor which is provided on the base substrate, and includes a second input electrode, a second output electrode, a second control electrode directly connected to a gate line of the plurality of gate lines, and a second semiconductor pattern including an oxide semiconductor material; and
a first insulating layer provided on the first semiconductor pattern and below the second semiconductor pattern; and
a second insulating layer provided on the second semiconductor pattern, wherein at least one dummy hole is defined to penetrate through the first insulating layer and the second insulating layer, and
in a plan view, the at least one dummy hole is not overlapped with the first and second thin-film transistors and is closer to the second semiconductor pattern than to the first semiconductor pattern, and
wherein the at least one dummy hole is not filled with a conductive material and provided to meet following inequality 1:

$$2 \text{ micrometers} \times 2 \text{ micrometers} \leq X \text{ micrometer}^2 \leq 2 \text{ micrometers} \times Y \text{ micrometer}, \quad \text{[Inequality 1]}$$

where X is a total planar area of the at least one dummy hole, and
Y is a length of the second semiconductor pattern, wherein Y is equal to or shorter than about 20 micrometers.

12. The semiconductor device of claim 11, wherein the first input electrode and the first output electrode are in contact with the first semiconductor pattern via a first through hole and a second through hole, respectively,
- the second input electrode and the second output electrode are in contact with the second semiconductor pattern via a third through hole and a fourth through hole, respectively, and
- a distance between a bottom end of the at least one dummy hole and a top surface of the base substrate is shorter than a distance between a bottom end of each of the first, second, third, and fourth through holes and the top surface of the base substrate.

13. The semiconductor device of claim 11, wherein at least a portion of the at least one dummy hole is filled with an insulating material.

14. The semiconductor device of claim 11, wherein a shortest distance between the at least one dummy hole and the second semiconductor pattern is equal to or shorter than 5 micrometers, in the plan view.

15. The semiconductor device of claim 11, wherein a shortest distance between the at least one dummy hole and the second semiconductor pattern is equal to or shorter than 2.5 micrometers, in the plan view.

16. The semiconductor device of claim 11, wherein the first insulating layer has a multi-layered structure.

17. The semiconductor device of claim 11, wherein a length of a channel region of the second semiconductor pattern is equal to or shorter than 2 micrometers.

18. The semiconductor device of claim 11, further comprising:
- a plurality of data lines; and
- wherein the second input electrode directly connected to a data line of the plurality of data lines.

* * * * *